United States Patent
Toyofuku et al.

(10) Patent No.: US 10,880,505 B2
(45) Date of Patent: Dec. 29, 2020

(54) SOLID STATE IMAGING DEVICE, DRIVING METHOD OF SOLID STATE IMAGING DEVICE, AND ELECTRONIC DEVICE

(71) Applicant: SONY SEMICONDUCTOR SOLUTIONS CORPORATION, Kanagawa (JP)

(72) Inventors: Takuya Toyofuku, Kanagawa (JP); Yorito Sakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/491,000

(22) PCT Filed: Dec. 12, 2017

(86) PCT No.: PCT/JP2017/044479
§ 371 (c)(1),
(2) Date: Sep. 4, 2019

(87) PCT Pub. No.: WO2018/168120
PCT Pub. Date: Sep. 20, 2018

(65) Prior Publication Data
US 2020/0021755 A1 Jan. 16, 2020

(30) Foreign Application Priority Data

Mar. 13, 2017 (JP) .................................. 2017-047056

(51) Int. Cl.
*H04N 5/355* (2011.01)
*H04N 5/3745* (2011.01)

(52) U.S. Cl.
CPC ........... *H04N 5/355* (2013.01); *H04N 5/3745* (2013.01)

(58) Field of Classification Search
CPC ............. H01L 27/146; H01L 27/14614; H01L 27/14621; H01L 27/14641;
(Continued)

(56) References Cited

U.S. PATENT DOCUMENTS 9,848,148 B1 * 12/2017 Johnson ............... H04N 5/3355
2006/0118837 A1 * 6/2006 Choi ................... H04N 5/37457
257/292

(Continued)

FOREIGN PATENT DOCUMENTS

JP  2000-059688  2/2000
JP  2014-060658  4/2014

(Continued)

OTHER PUBLICATIONS

International Search Report prepared by the Japan Patent Office dated Jan. 16, 2018, for International Application No. PCT/JP2017/044479.

*Primary Examiner* — Chiawei Chen
(74) *Attorney, Agent, or Firm* — Sheridan Ross P.C.

(57) ABSTRACT

To reduce variations in switching timing from linear reading to logarithmic reading and perform reading with high accuracy in a solid state imaging device. A first photoelectric conversion unit converts incident light into charges and accumulates the charges in a first region. A second photoelectric conversion unit converts incident light into charges and accumulates the charges in a second region having a smaller area than the first region. A charge-voltage conversion unit accumulates charges photoelectrically converted by the first and second photoelectric conversion units for converting the charges into a voltage. First and second charge transfer units transfer charges accumulated in the first photoelectric conversion unit and charges accumulated in the second photoelectric conversion unit to the charge-voltage conversion unit, respectively. A charge reset unit (Continued)

resets charges accumulated in the charge-voltage conversion unit. A first discharging unit discharges charges accumulated in the first photoelectric conversion unit.

6 Claims, 13 Drawing Sheets

(58) Field of Classification Search
CPC .............. H01L 27/14645; H04N 5/355; H04N 5/3745; H04N 5/3559; H04N 5/3765
See application file for complete search history.

(56) References Cited

U.S. PATENT DOCUMENTS

| | | | |
|---|---|---|---|
| 2007/0132870 A1* | 6/2007 | Ahn | ........................ H04N 5/355 348/308 |
| 2007/0141801 A1* | 6/2007 | Kwon | ................. H01L 27/1463 438/400 |
| 2009/0002528 A1* | 1/2009 | Manabe | ............... H04N 5/2355 348/248 |
| 2014/0077059 A1 | 3/2014 | Sakano | |
| 2014/0224974 A1* | 8/2014 | Kenny | .................... H01J 49/26 250/282 |
| 2014/0246561 A1* | 9/2014 | Chen | ................. H01L 27/14689 250/208.1 |
| 2015/0123172 A1* | 5/2015 | Chen | ................. H01L 27/14645 257/230 |
| 2015/0311245 A1 | 10/2015 | Yamazaki et al. | |
| 2016/0219236 A1* | 7/2016 | Maeda | ................. H01L 27/1464 |
| 2017/0347047 A1* | 11/2017 | Mao | ................. H04N 5/23229 |
| 2018/0054576 A1* | 2/2018 | Otaka | .................... H04N 5/379 |
| 2018/0352176 A1* | 12/2018 | Zhou | ................. H04N 5/23245 |

FOREIGN PATENT DOCUMENTS

| | | |
|---|---|---|
| JP | 2015-216369 | 12/2015 |
| WO | WO 2016/199588 | 12/2016 |

* cited by examiner

FIG. 11
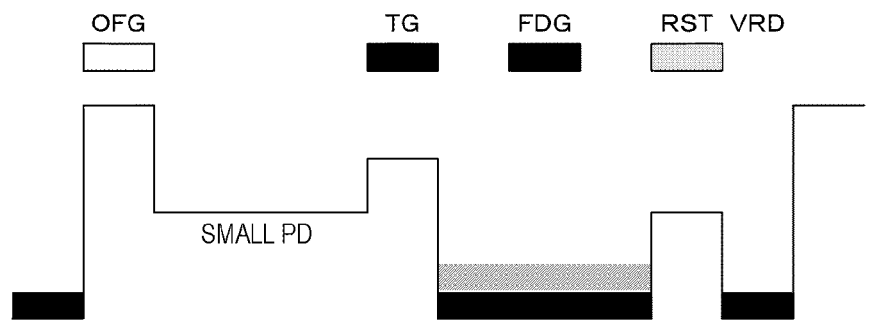
a  LOGARITHMIC READING (SMALL PD)
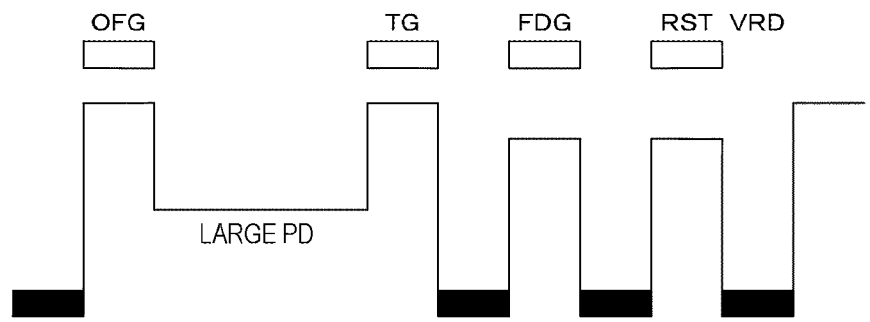
b  HIGH-SENSITIVITY READING (LARGE PD)
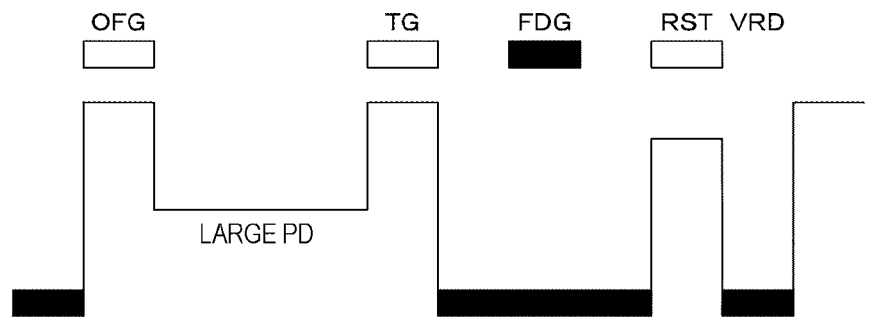
c  NORMAL-SENSITIVITY READING (LARGE PD)

FIG. 12
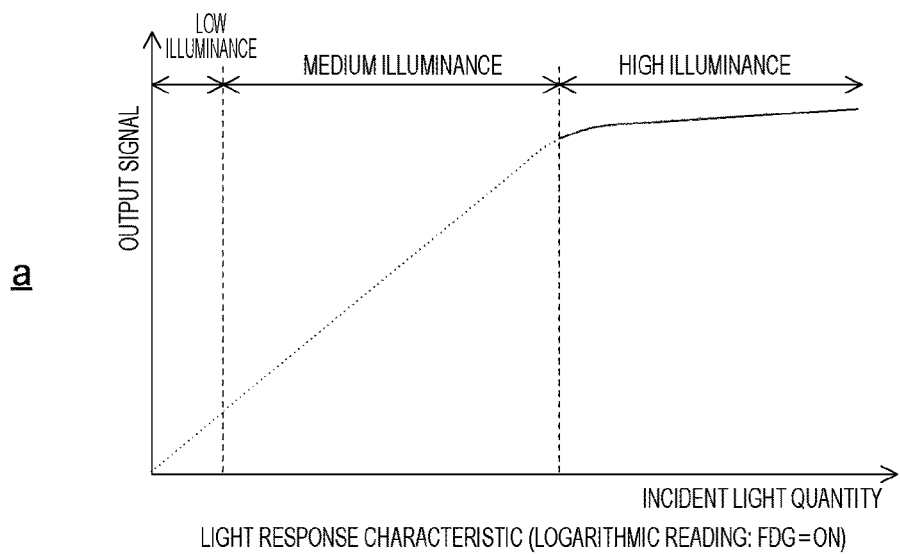
a
LIGHT RESPONSE CHARACTERISTIC (LOGARITHMIC READING: FDG=ON)
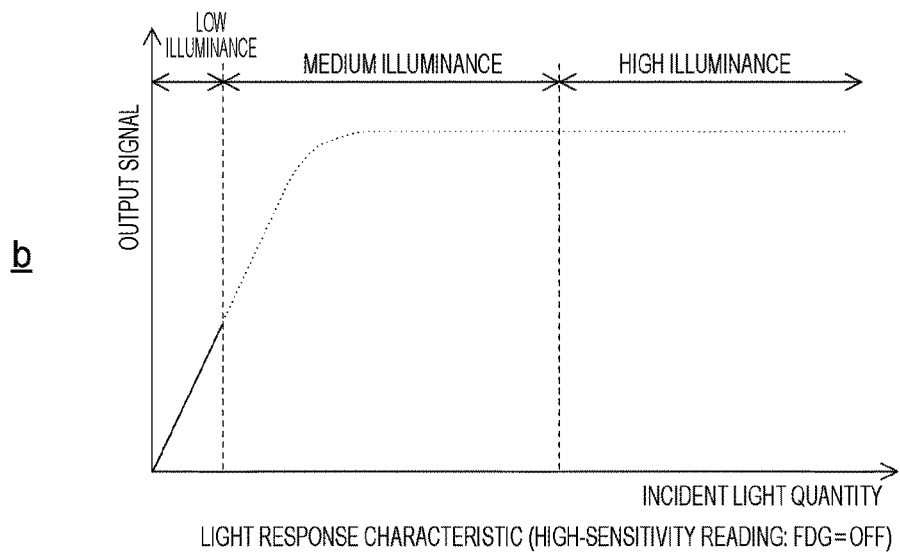
b
LIGHT RESPONSE CHARACTERISTIC (HIGH-SENSITIVITY READING: FDG=OFF)
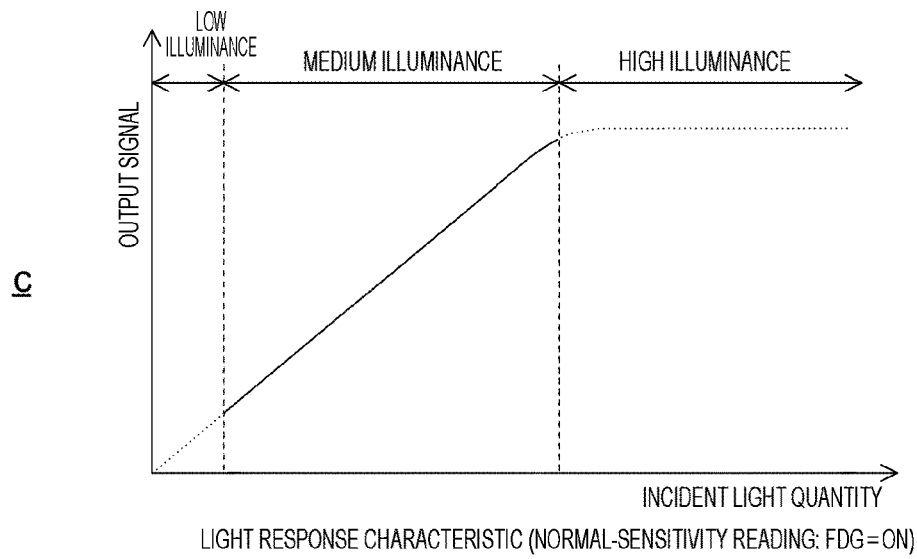
c
LIGHT RESPONSE CHARACTERISTIC (NORMAL-SENSITIVITY READING: FDG=ON)

SOLID STATE IMAGING DEVICE, DRIVING METHOD OF SOLID STATE IMAGING DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2017/044479 having an international filing date of 12 Dec. 2017, which designated the United States, which PCT application claimed the benefit of Japanese Patent Application No. 2017-047056 filed 13 Mar. 2017, the entire disclosures of each of which are incorporated herein by reference.

TECHNICAL FIELD

The present technology relates to a solid state imaging device. Specifically, the present technology relates to a solid state imaging device, a driving method of the solid state imaging device, and an electronic device that reduce variations in signals at high illuminance exceeding a saturation level.

BACKGROUND ART

In typical metal oxide semiconductor (MOS) type image sensors in which charges accumulated in a photoelectric conversion unit according to an incident light quantity are read through a MOS transistor, a saturation level thereof is limited according to the amount of charges that can be accumulated in the photoelectric conversion unit. In other words, it is impossible to correctly detect a light quantity in a range exceeding the saturation level of the photoelectric conversion unit. Thus, there has been conventionally used an operation in which charges accumulated in a photoelectric conversion unit are caused to overflow from a transfer gate to a charge-voltage conversion unit, a charge reset unit, and a drain power source, and a voltage of the charge-voltage conversion unit at that time is detected as a signal voltage (hereinbelow, referred to as logarithmic reading). The voltage detected at this time is a signal corresponding to the logarithm of an incident light quantity. With this configuration, a light quantity exceeding the saturation level can also be detected.

In a case where such logarithmic reading is performed together with normal reading by accumulation (hereinbelow, referred to as linear reading), there is a problem in that the difference in the switching timing from the linear reading to the logarithmic reading varies from pixel to pixel. This occurs because the saturation level of the photoelectric conversion unit and thresholds of transistors of the transfer gate and a charge reset unit for determining a level at which overflow is started vary from pixel to pixel. Thus, in a conventional technology, before a signal of logarithmic reading is acquired, charges are injected into the photoelectric conversion unit and the charge-voltage conversion unit from the drain power source up to the saturation level, and the charge reset unit is then reset at an intermediate level between a high level and a low level. This reduces variations in the charge reset unit and reduces variations in the charge-voltage conversion unit from pixel to pixel. Further, in this state, the transfer gate is opened to transfer a signal (saturation level) of the photoelectric conversion unit to the charge-voltage conversion unit, and light reception is started, so that variations in the photoelectric conversion unit and the transfer gate from pixel to pixel are reduced. When noise is read out, the transfer gate is opened with the photoelectric conversion unit and the charge-voltage conversion unit filled with charges and the charge reset unit is brought to the intermediate level again, and charges accumulated in the charge-voltage conversion unit are read out. These operations reduce variations from pixel to pixel and reduce variations in the switching timing from the linear reading to the logarithmic reading (e.g., refer to Patent Document 1).

CITATION LIST

Patent Document

Patent Document 1: Japanese Patent Application Laid-Open No. 2014-060658

SUMMARY OF THE INVENTION

Problems to be Solved by the Invention

In the conventional technology described above, when linear reading and logarithmic reading are performed in one pixel, variations from pixel to pixel are reduced, and variations in the switching timing from the linear reading to the logarithmic reading are reduced. In this regard, in a case where a light quantity of high illuminance is read by logarithmic reading, it is necessary to cause charges to overflow from the photoelectric conversion unit up to the drain power source. Thus, a small photoelectric conversion unit is advantageous. On the other hand, in a case where the photoelectric conversion unit is downsized, the sensitivity is insufficient to read a light quantity of low illuminance by linear reading. Further, in the conventional technique described above, the photoelectric conversion unit receives light also when noise is read in the operation for reducing variations. In a case where the illuminance is high, there is a possibility that charges overflow from the transfer gate and mix into the charge-voltage conversion unit immediately after reset in the intermediate level.

The present technology has been produced in view of such circumstances, and an object thereof is to reduce variations in the switching timing from linear reading to logarithmic reading and perform reading with high accuracy in a solid state imaging device.

Solutions to Problems

The present technology has been made to solve the above problems, and a first aspect thereof is a solid state imaging device including a first photoelectric conversion unit configured to photoelectrically convert incident light into charges and accumulate the charges in a first region, a second photoelectric conversion unit configured to photoelectrically convert incident light into charges and accumulate the charges in a second region having a smaller area than the first region, a charge-voltage conversion unit configured to accumulate charges photoelectrically converted by the first photoelectric conversion unit and the second photoelectric conversion unit for converting the charges into a voltage, a first charge transfer unit configured to transfer charges accumulated in the first photoelectric conversion unit to the charge-voltage conversion unit, a second charge transfer unit configured to transfer charges accumulated in the second photoelectric conversion unit to the charge-voltage conversion unit, a charge reset unit configured to reset charges accumulated in the charge-voltage conversion unit, and a first discharging unit configured to discharge charges accumulated in the first photoelectric conversion unit, and a driving method of the solid state imaging device. This configuration brings about an action of preventing unnecessary charges from mixing into the first photoelectric conversion unit.

Further, in the first aspect, the solid state imaging device may further include a driving unit configured to perform driving in such a manner that the driving unit controls a potential of a drain of the charge reset unit while causing the first discharging unit to discharge charges accumulated in the first photoelectric conversion unit to accumulate the charges in the second photoelectric conversion unit and the charge-voltage conversion unit up to a saturation level, and then exposes the second photoelectric conversion unit to light. This configuration brings about an action of preventing unnecessary charges from mixing into the first photoelectric conversion unit by discharging charges accumulated in the first photoelectric conversion unit in logarithmic reading by the second photoelectric conversion unit.

Further, in the first aspect, the solid state imaging device may further include a second discharging unit configured to discharge charges accumulated in the second photoelectric conversion unit, and the driving unit may perform driving in such a manner that the driving unit controls the potential of the drain of the charge reset unit while causing the first discharging unit to discharge charges accumulated in the first photoelectric conversion unit to accumulate charges in the second photoelectric conversion unit and the charge-voltage conversion unit up to a saturation level, then applies an intermediate potential to the charge reset unit while causing the second discharging unit to discharge charges accumulated in the second photoelectric conversion unit to accumulate charges in the charge-voltage conversion unit, further brings the charge reset unit to a nonconducting state and then causes charges accumulated in the charge-voltage conversion unit to be transferred to the charge-voltage conversion unit, and then exposes the second photoelectric conversion unit to light. This configuration brings about an action of preventing unnecessary charges from mixing into the charge-voltage conversion unit by discharging charges accumulated in the second photoelectric conversion unit during a reset operation by the intermediate potential in logarithmic reading in the second photoelectric conversion unit.

Further, in the first aspect, the solid state imaging device may further include a signal amplifying unit configured to amplify charges accumulated in the charge-voltage conversion unit and output a pixel signal of a level corresponding to the charges. Further, the solid state imaging device may further include a conversion efficiency switching unit configured to switch a capacitance of the charge-voltage conversion unit to switch an amplification degree in the signal amplifying unit. This configuration brings about an action of obtaining a sufficient resolution by switching the capacitance of the charge-voltage conversion unit with respect to a low illuminance signal.

Further, a second aspect of the present technology is an electronic device including a first photoelectric conversion unit configured to photoelectrically convert incident light into charges and accumulate the charges in a first region, a second photoelectric conversion unit configured to photoelectrically convert incident light into charges and accumulate the charges in a second region having a smaller area than the first region, a charge-voltage conversion unit configured to accumulate charges photoelectrically converted by the first photoelectric conversion unit and the second photoelectric conversion unit for converting the charges into a voltage, a first charge transfer unit configured to transfer charges accumulated in the first photoelectric conversion unit to the charge-voltage conversion unit, a second charge transfer unit configured to transfer charges accumulated in the second photoelectric conversion unit to the charge-voltage conversion unit, a charge reset unit configured to reset charges accumulated in the charge-voltage conversion unit, a first discharging unit configured to discharge charges accumulated in the first photoelectric conversion unit, and a driving unit configured to perform driving in such a manner that the driving unit controls a potential of a drain of the charge reset unit while causing the first discharging unit to discharge charges accumulated in the first photoelectric conversion unit to accumulate the charges in the second photoelectric conversion unit and the charge-voltage conversion unit up to a saturation level, and then exposes the second photoelectric conversion unit to light. This configuration brings about an action of preventing unnecessary charges from mixing into the first photoelectric conversion unit by discharging charges accumulated in the first photoelectric conversion unit in logarithmic reading by the second photoelectric conversion unit.

Effects of the Invention

The present technology can achieve excellent effects capable of reducing variations in the switching timing from linear reading to logarithmic reading and performing reading with high accuracy in a solid state imaging device. Note that the effects of the present technology are not necessarily limited to the effects described herein and may be any effect described in the present disclosure.

BRIEF DESCRIPTION OF DRAWINGS

FIG. 11 is a diagram illustrating an exemplary potential in an operating state of the second embodiment of the present technology.

FIG. 12 is a diagram illustrating an example of a light response characteristic of each pixel of the pixel array unit 100 in the second embodiment of the present technology.

MODE FOR CARRYING OUT THE INVENTION

Hereinbelow, modes for carrying out the present technology (hereinbelow, referred to as the embodiments) will be described. The description will be made in the following order.

1. First Embodiment (example in which discharging unit is disposed in photoelectric conversion unit)
2. Second Embodiment (charge-voltage control unit is disposed between pixels)

1. First Embodiment

[Configuration of Solid State Imaging Device]

Figure 1:
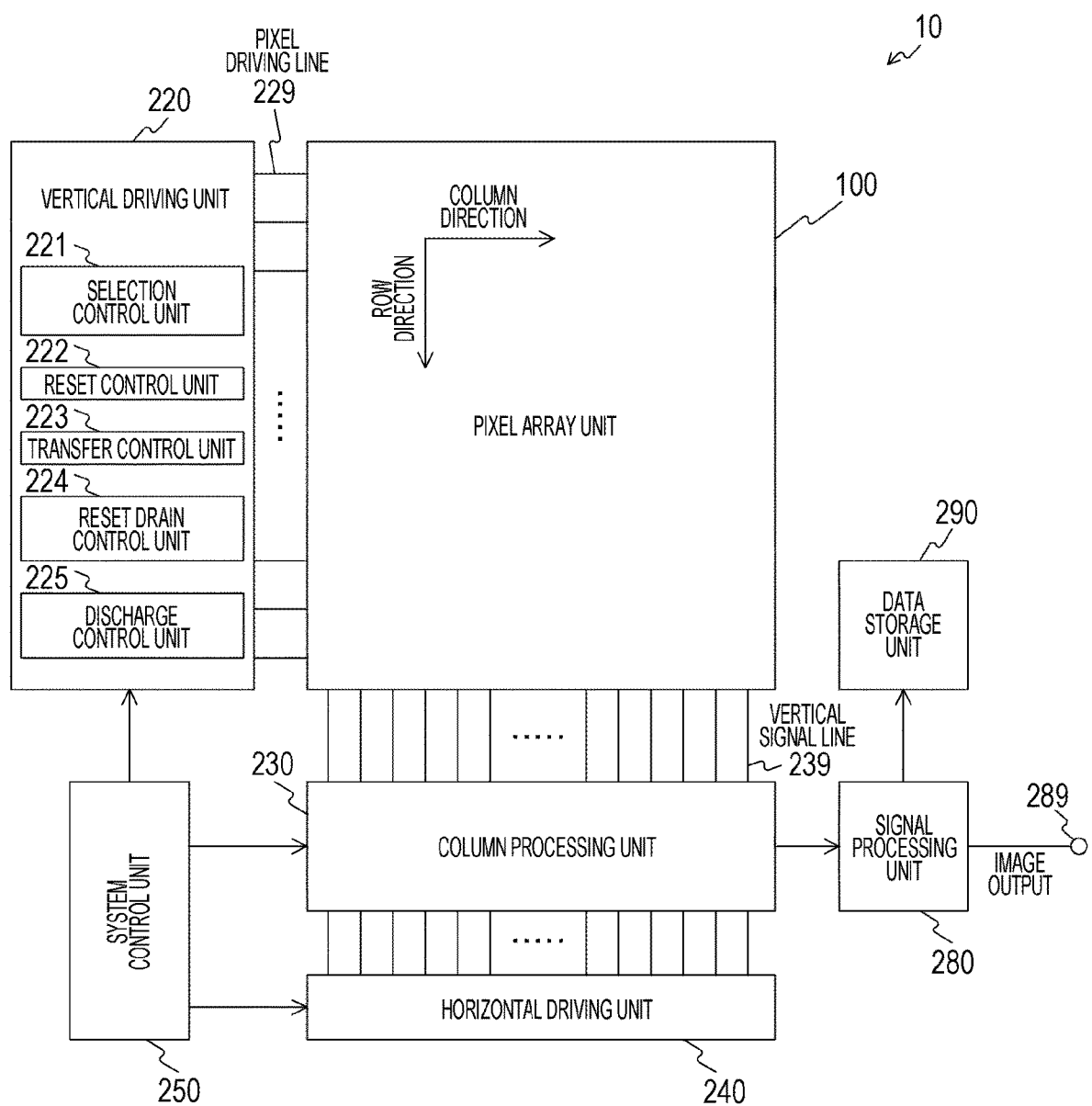
FIG. 1 is a diagram illustrating an exemplary configuration of a solid state imaging device 10 in an embodiment of the present technology.

FIG. 1 is a diagram illustrating an exemplary configuration of a solid state imaging device 10 in an embodiment of the present technology. The solid state imaging device 10 includes, for example, a MOS type image sensor, and captures an image by photoelectrically converting incident light and generating an image signal. The solid state imaging device 10 includes a pixel array unit 100, a vertical driving unit 220, a column processing unit 230, a horizontal driving unit 240, a system control unit 250, a signal processing unit 280, and a data storage unit 290.

The pixel array unit 100 includes pixels each of which includes a photoelectric conversion unit which generates charges according to the quantity of light incident from a subject and accumulates the charges, the pixels being two-dimensionally arranged in the lateral direction (the row direction) and the longitudinal direction (the column direction). In the pixel array unit 100, a pixel driving line 229 is arranged in the row direction for each pixel row including pixels arrayed in the row direction, and a vertical signal line (VSL) 239 is arranged in the column direction for each pixel column including pixels arrayed in the column direction.

The vertical driving unit 220 includes a shift resister, an address decoder, and the like, and supplies a signal or the like to pixels through a plurality of pixel driving lines 229 to drive the pixels of the pixel array unit 100. The vertical driving unit 220 includes a selection control unit 221, a reset control unit 222, a transfer control unit 223, a reset drain control unit 224, and a discharge control unit 225. The selection control unit 221 controls a selection signal SEL to be applied to a pixel selecting unit which will be described later. The reset control unit 222 controls a reset signal RST to be applied to a charge reset unit which will be described later. The transfer control unit 223 controls a transfer signal TRG to be applied to a charge transfer unit which will be described later. The reset drain control unit 224 controls a potential of a reset drain of the charge reset unit which will be described later. The discharge control unit 225 controls a discharge signal OFG to be applied to a discharging unit which will be described later. Note that the vertical driving unit 220 is an example of the driving unit described in the claims.

The column processing unit 230 reads signals from the respective pixels through the vertical signal line 239 for each pixel column of the pixel array unit 100, and performs a noise reduction process, a correlated double sampling process, an analog to digital (AD) conversion process, and the like to generate a pixel signal.

The horizontal driving unit 240 includes a shift resister, an address decoder, and the like, and sequentially selects unit circuits corresponding to the pixel columns of the column processing unit 230. Pixel signals which have been subjected to signal processing for each unit circuit in the column processing unit 230 are sequentially output to the signal processing unit 280 by the selective scanning performed by the horizontal driving unit 240.

The system control unit 250 includes a timing generator which generates various kinds of driving signals and the like, and controls driving of the vertical driving unit 220, the column processing unit 230, and the horizontal driving unit 240 on the basis of the driving signal generated by the timing generator.

The signal processing unit 280 performs signal processing such as arithmetic processing on each pixel signal supplied from the column processing unit 230, and outputs an image signal based on the pixel signal.

The data storage unit 290 stores the image signal processed by the signal processing unit 280 therein.

[Circuit Configuration]

Figure 2:
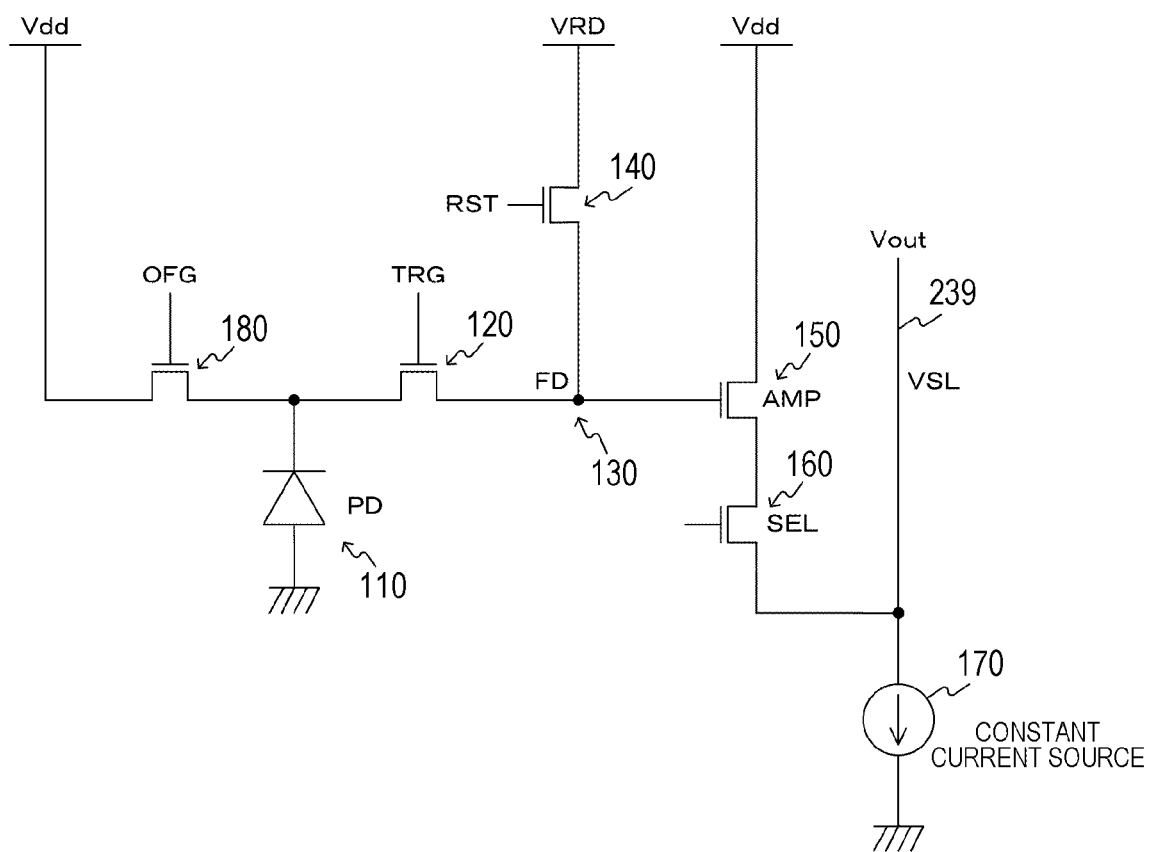
FIG. 2 is a diagram illustrating an exemplary circuit configuration for describing the operation of each pixel of a pixel array unit 100 in the embodiment of the present technology.

FIG. 2 is a diagram illustrating an exemplary circuit configuration for describing the operation of each pixel of the pixel array unit 100 in the embodiment of the present technology. Hereinbelow, a basic configuration as a premise will be described before describing the configuration of each pixel of the pixel array unit 100. First, it is assumed that each pixel of the pixel array unit 100 includes a photoelectric conversion unit 110, a charge transfer unit 120, a charge-voltage conversion unit 130, a charge reset unit 140, a signal amplifying unit 150, a pixel selecting unit 160, a constant current source 170, and a discharging unit 180.

The photoelectric conversion unit 110 includes a PN junction photodiode (PD), and generates and accumulates charges according to an incident light quantity.

The charge transfer unit 120 transfers charges accumulated in the photoelectric conversion unit 110 to the charge-voltage conversion unit 130 in accordance with the transfer signal TRG. When the transfer signal TRG applied to the charge transfer unit 120 transitions to an H the charge transfer unit 120 enters a conducting state, and charges accumulated in the photoelectric conversion unit 110 are transferred to the charge-voltage conversion unit 130. Note that the charge transfer unit 120 includes, for example, a depression transistor or the like, and constitutes an overflow path which transfers some charges even when the charge transfer unit 120 is in a nonconducting state. Thus, when the photoelectric conversion unit 110 becomes saturated, charges overflowing from the photoelectric conversion unit 110 are transferred to the charge-voltage conversion unit 130 through the overflow path.

The charge-voltage conversion unit 130 is a floating diffusion (FD) capacitor which is formed between a drain of the charge transfer unit 120 and a source of the charge reset unit 140. The charge-voltage conversion unit 130 accumulates charges transferred from the charge transfer unit 120.

The charge reset unit 140 resets charges accumulated in the charge-voltage conversion unit 130 in accordance with the reset signal RST. When the reset signal RST applied to the charge reset unit 140 transitions to the H level, the charge reset unit 140 enters a conducting state and resets charges accumulated in the charge-voltage conversion unit 130. Further, the charge reset unit 140 includes a depression transistor or the like, and constitutes an overflow path which transfers some charges even when the charge reset unit 140 is in a nonconducting state. Thus, when the charge-voltage conversion unit 130 becomes saturated, the overflow path allows charges overflowing from the charge-voltage conversion unit 130 to be transferred to a drain (reset drain) of the charge reset unit 140.

The signal amplifying unit 150 amplifies charges accumulated in the charge-voltage conversion unit 130 and outputs a pixel signal of a level corresponding to the charges. The signal amplifying unit 150 includes a gate electrode connected to the charge-voltage conversion unit 130 and a drain connected to a power voltage Vdd, and serves as an input unit of a read circuit which reads charges obtained by photoelectric conversion in the photoelectric conversion unit 110, that is, a so-called source follower circuit. In other words, the signal amplifying unit 150 includes a source connected to the vertical signal line 239 through the pixel selecting unit 160, and thus constitutes the source follower circuit together with the constant current source 170 which is connected to one end of the vertical signal line 239.

The pixel selecting unit 160 selects any of the pixels in the pixel array unit 100. The pixel selecting unit 160 is connected between the source of the signal amplifying unit 150 and the vertical signal line 239, and the selection signal SEL is supplied to a gate electrode of the pixel selecting unit 160. When the selection signal SEL transitions to the H level, the pixel selecting unit 160 enters a conducting state, that is, a pixel is brought to a selected state. When the pixel is brought to the selected state, a signal output from the signal amplifying unit 150 is read out to the column processing unit 230 through the vertical signal line 239.

The discharging unit 180 discharges charges accumulated in the photoelectric conversion unit 110 in accordance with an overflow gate signal OFG. As described above, in the conventional technology, the photoelectric conversion unit receives light also when noise is read in the operation for reducing variations. In a case where the illuminance is high, there is a possibility that charges overflow from the transfer gate and mix into the charge-voltage conversion unit immediately after reset in the intermediate level. Thus, in the present embodiment, the discharging unit 180 is disposed and kept open during a reset operation in logarithmic reading to selectively discharge charges accumulated by light reception in the photoelectric conversion unit 110.

[Light Response Characteristic]

Figure 3:
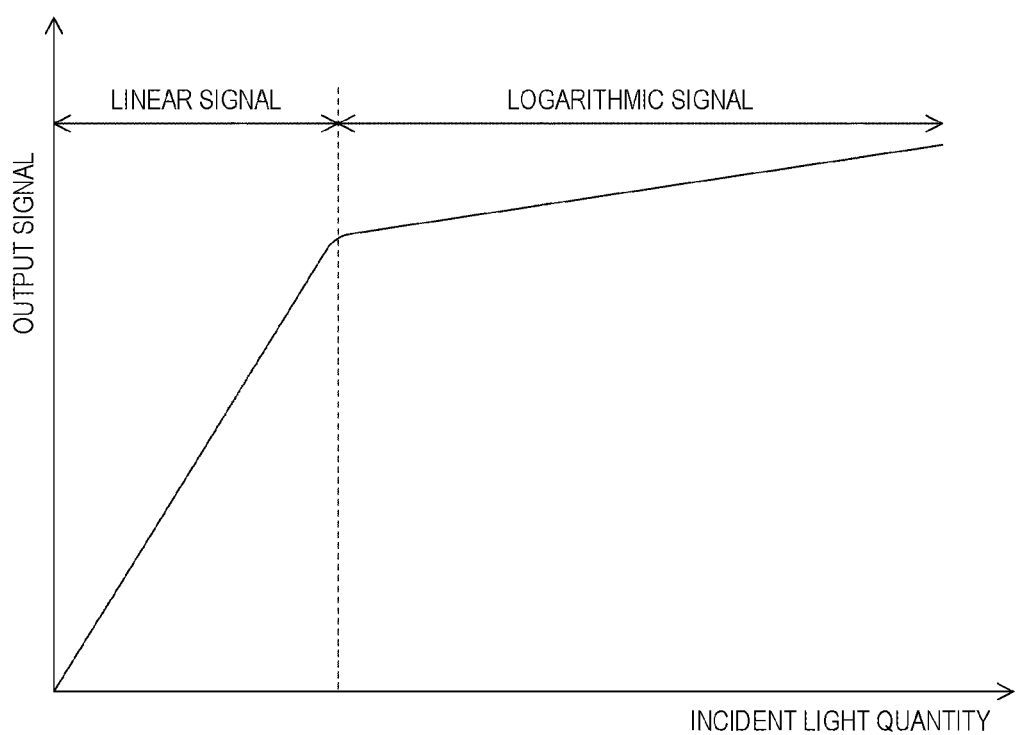
FIG. 3 is a diagram illustrating an example of a light response characteristic of each pixel of the pixel array unit 100 in the embodiment of the present technology.

FIG. 3 is a diagram illustrating an example of a light response characteristic of each pixel of the pixel array unit 100 in the embodiment of the present technology. In a case where the incident light quantity corresponds to a relatively low illuminance, the output signal is a linear signal which is linear with respect to the incident light quantity. Such reading at low illuminance is referred to as linear reading as described above.

On the other hand, in a case where the incident light quantity corresponds to a relatively high illuminance, charges accumulated in the photoelectric conversion unit 110 overflow from the charge transfer unit 120 to the charge-voltage conversion unit 130, the charge reset unit 140, and the reset drain. Thus, a voltage detected at this time is a logarithmic signal corresponding to the logarithm of the incident light quantity. Such reading at high illuminance is referred to as logarithmic reading as described above.

In order to reduce variations in a difference of the switching timing from the linear reading to the logarithmic reading, when noise is read out, the charge reset unit 140 is brought to an intermediate level with the photoelectric conversion unit 110 and the charge-voltage conversion unit 130 filled with charges, and the charge transfer unit 120 is then opened. Although charges accumulated in the charge-voltage conversion unit 130 are read as noise in this manner, since the photoelectric conversion unit 110 receives light also during this time, there is a possibility that charges overflow from the charge transfer unit 120 and mix into the charge-voltage conversion unit 130 immediately after reset in the intermediate level in a case where the illuminance is high. Thus, in the present embodiment, the discharging unit 180 is disposed and kept open during a reset operation in logarithmic reading to selectively discharge charges accumulated by light reception in the photoelectric conversion unit 110.

[Reading Timing]

Figure 4:
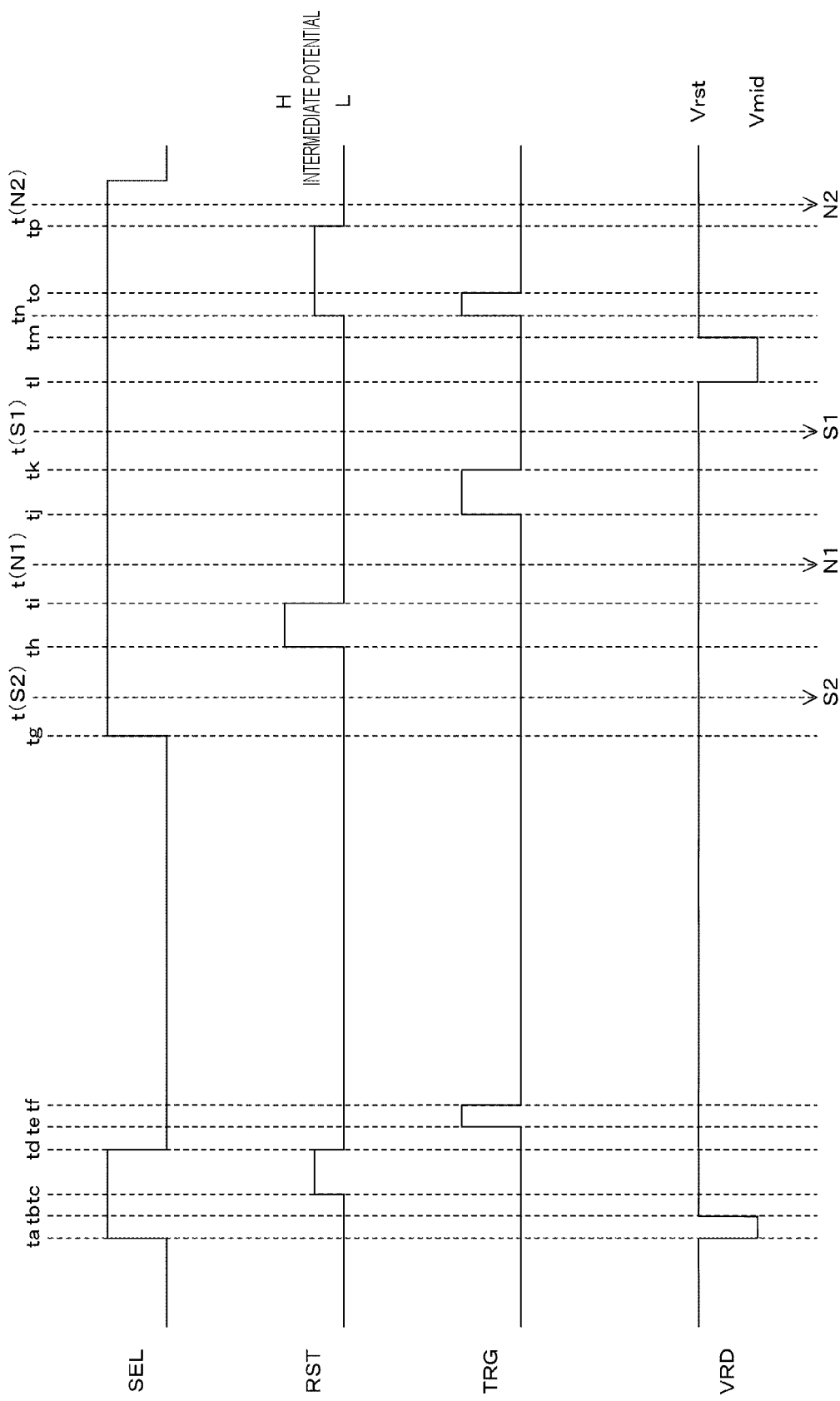
FIG. 4 is a diagram illustrating an example of a reading timing of each pixel of the pixel array unit 100 in the embodiment of the present technology.
Figure 5:
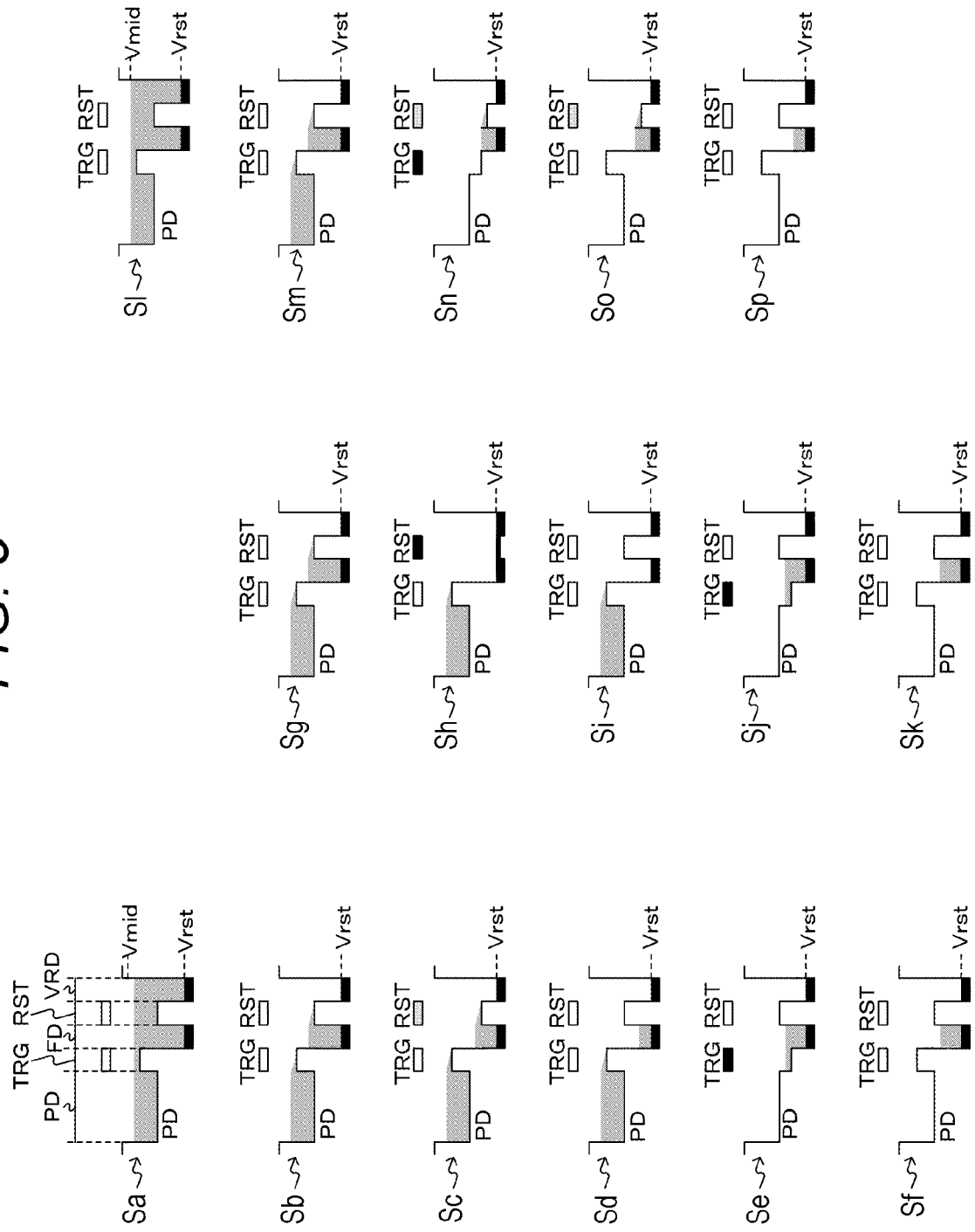
FIG. 5 is a diagram illustrating an exemplary potential at high illuminance corresponding to FIG. 4.
Figure 6:
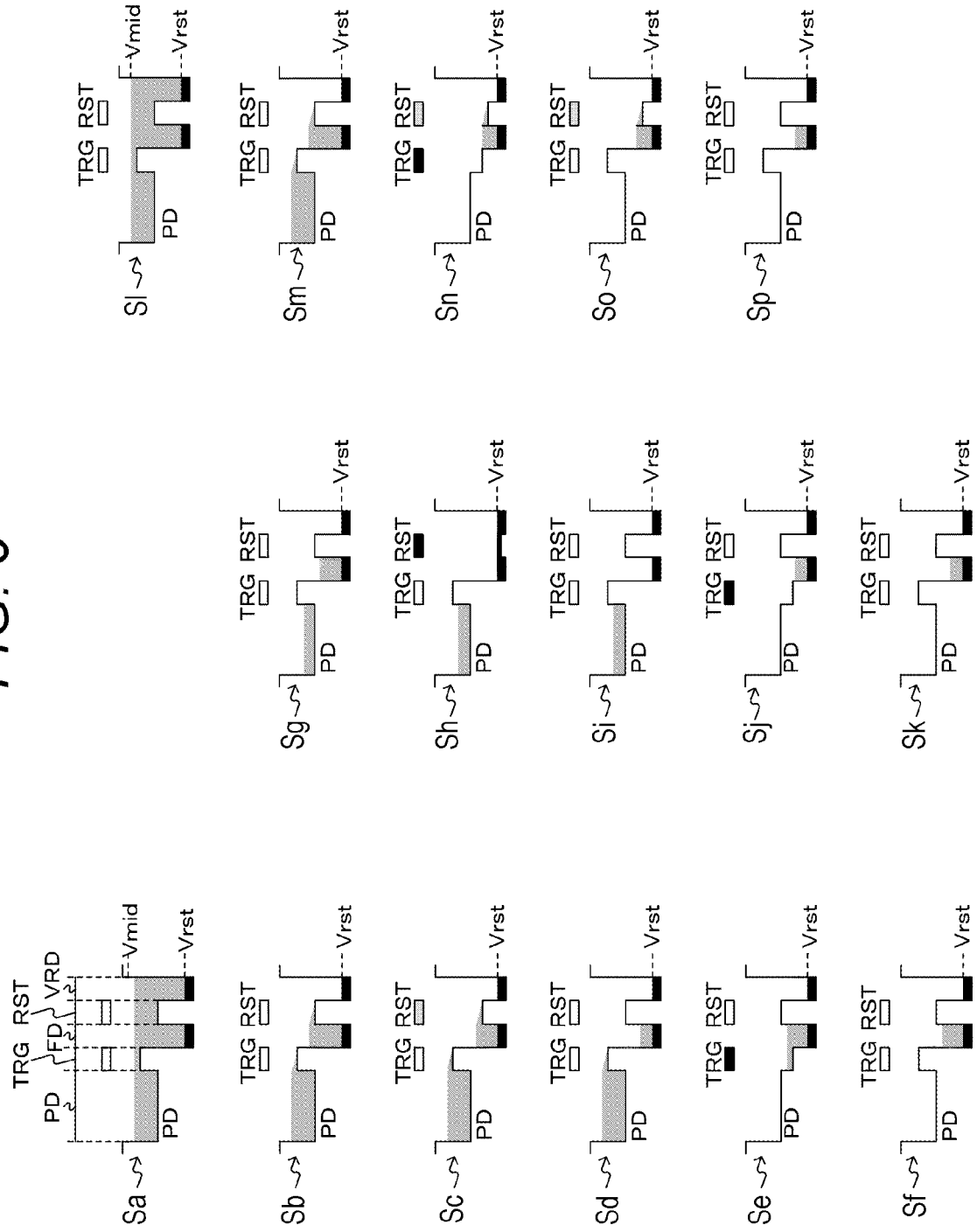
FIG. 6 is a diagram illustrating an exemplary potential at low illuminance corresponding to FIG. 4.

FIG. 4 is a diagram illustrating an example of a reading timing of each pixel of the pixel array unit 100 in the embodiment of the present technology. FIG. 5 is a diagram illustrating an exemplary potential at high illuminance corresponding to FIG. 4. FIG. 6 is a diagram illustrating an exemplary potential at low illuminance corresponding to FIG. 4. Note that, here, an exemplary operation in a case where the discharging unit 180 is not disposed is illustrated.

At a time ta, the reset drain control unit 224 changes a voltage VRD of the reset drain as the drain of the charge reset unit 140 from a reset potential Vrst to a voltage Vmid at which charges in the photoelectric conversion unit 110 are saturated. As a result, as illustrated in a state Sa, the photoelectric conversion unit 110, the charge transfer unit 120, the charge-voltage conversion unit 130, the charge reset unit 140, and the reset drain are filled with charges.

At a time tb, the reset drain control unit 224 returns the reset drain voltage VRD to the reset voltage Vrst. At this time, the charge transfer unit 120 and the charge reset unit 140 remain in a nonconducting state. As a result, the photoelectric conversion unit 110 and the charge-voltage conversion unit 130 reach the respective saturation levels as illustrated in a state Sb.

At a time tc, the reset control unit 222 applies an intermediate potential to the reset signal RST. In response to this, the charge reset unit 140 is turned on in the state of the intermediate potential. As a result, as illustrated in a state Sc, charges accumulated in the charge reset unit 140 by the intermediate potential are left in the charge-voltage conversion unit 130.

At a time td, the reset control unit 222 brings the reset signal RST to an L level. In response to this, the charge reset unit 140 enters a nonconducting state. As a result, as illustrated in a state Sd, charges accumulated in the charge reset unit 140 by the intermediate potential is accumulated in the charge-voltage conversion unit 130.

At a time te, the transfer control unit 223 brings the transfer signal TRG to the H level. In response to this, the charge transfer unit 120 enters a conducting state.

At a time tf, the transfer control unit 223 brings the transfer signal TRG to the L level. As a result, as illustrated in a state Sf, charges in which charges of the saturation level of the photoelectric conversion unit 110 are added to charges accumulated in the charge reset unit 140 by the intermediate potential are accumulated in the charge-voltage conversion unit 130. In other words, charges corresponding to the saturation charge amount of the photoelectric conversion unit 110 are accumulated in the charge-voltage conversion unit 130.

Then, from a time tf to a time tg, the pixel is in an exposed state, and charges according to the exposure time are accumulated in the photoelectric conversion unit 110. Note that the length between the time tf and the time tg can be flexibly set as the exposure time.

When the exposure time elapses, the photoelectric conversion unit 110 and the charge-voltage conversion unit 130 reach the respective saturation levels at high illuminance as illustrated in a state Sg of FIG. 5. The charge transfer unit 120 and the charge reset unit 140 have the overflow paths through which charges are transferred even in a nonconducting state, and an electric current proportional to the incident light quantity thus flows to the charge-voltage conversion unit 130. It is known that the voltage of the charge-voltage conversion unit 130 like this has a value according to the logarithm of the incident light quantity. At the time tg, the selection control unit 221 brings the selection signal SEL to the H level. As a result, the pixel selecting unit 160 enters a conducting state, that is, the pixel is brought to a selected state. At a time t (S2), the column processing unit 230 reads the potential of the charge-voltage conversion unit 130 at this time as a signal S2 at high illuminance.

On the other hand, although, as illustrated in a state Sg of FIG. 6, charges according to the exposure time are accumulated in the photoelectric conversion unit 110 at the time tg at low illuminance, charges accumulated in the photoelectric conversion unit 110 at low illuminance are not saturated. Thus, at the time t (S2), the column processing unit 230 reads the potential of the charge-voltage conversion unit 130 at this time as the signal S2 at high illuminance. In other words, in a case where the illuminance is high, charges accumulated in the charge-voltage conversion unit 130 are read as the signal S2 without change in the state Sf.

At a time th, when the reset control unit 222 brings the reset signal RST to the H level, the charge reset unit 140 enters a conducting state. As a result, as illustrated in a state Sh, charges accumulated in the charge-voltage conversion unit 130 are discharged to the reset drain through the charge reset unit 140.

At a time ti, when the reset control unit 222 brings the reset signal RST to the L level, the charge reset unit 140 enters a nonconducting state.

At a time t (N1), the column processing unit 230 reads the potential of the charge-voltage conversion unit 130 as a noise signal N1 at low illuminance.

At a time tj, when the transfer control unit 223 brings the transfer signal TRG to the H level, the charge transfer unit 120 enters a conducting state. As a result, as illustrated in a state Sj, charges accumulated in the photoelectric conversion unit 110 are transferred to the charge-voltage conversion unit 130.

At a time tk, the transfer control unit 223 stops generating the transfer signal TRG. Accordingly, the charge transfer unit 120 enters an off state, and the charges accumulated in the photoelectric conversion unit 110 are thus not transferred. As a result, as illustrated in a state Sk, charges read from the photoelectric conversion unit 110 are accumulated in the charge-voltage conversion unit 130.

Thus, at a time t (S1), the column processing unit 230 reads the potential of the charge-voltage conversion unit 130 at this time as the signal S1 at low illuminance.

At a time tl, the reset drain control unit 224 changes the reset drain voltage VRD from the reset potential Vrst to the voltage Vmid at which charges in the photoelectric conversion unit 110 are saturated again. As a result, as illustrated in a state Sl, all of the photoelectric conversion unit 110, the charge-voltage conversion unit 130, and the reset drain have the voltage Vmid and enter the state filled with charges in a manner similar to the state Sa.

Further, at a time tm, the reset drain control unit 224 returns the reset drain voltage VRD the reset voltage Vrst. At this time, the charge transfer unit 120 and the charge reset unit 140 remain in the nonconducting state. As a result, as illustrated in a state Sm, the photoelectric conversion unit 110 and the charge-voltage conversion unit 130 reach the respective saturation levels.

At a time tn, the reset control unit 222 applies the intermediate potential to the reset signal RST. Further, the transfer control unit 223 brings the transfer signal TRG to the H level. As a result, as illustrated in a state Sn, charges accumulated in the charge reset unit 140 by the intermediate potential are left in the charge-voltage conversion unit 130.

At a time to, the transfer control unit 223 brings the transfer signal TRG to the L level. In response to this, the charge transfer unit 120 enters a nonconducting state.

At a time tp, the reset control unit 222 brings the reset signal RST to the L level. In response to this, the charge reset unit 140 enters a nonconducting state.

At a time t (N2), the column processing unit 230 reads the potential of the charge-voltage conversion unit 130 as the noise signal N2 at high illuminance. Accordingly, it is possible to reduce an influence caused by variations in a threshold Vth of the charge reset unit 140 on each pixel by subtracting the noise signal N2 from the pixel signal S2.

In other words, the column processing unit 230 outputs (S1-N1) as an image signal at low illuminance, and outputs (S2-N2) as an image signal at high illuminance.

Figure 7:
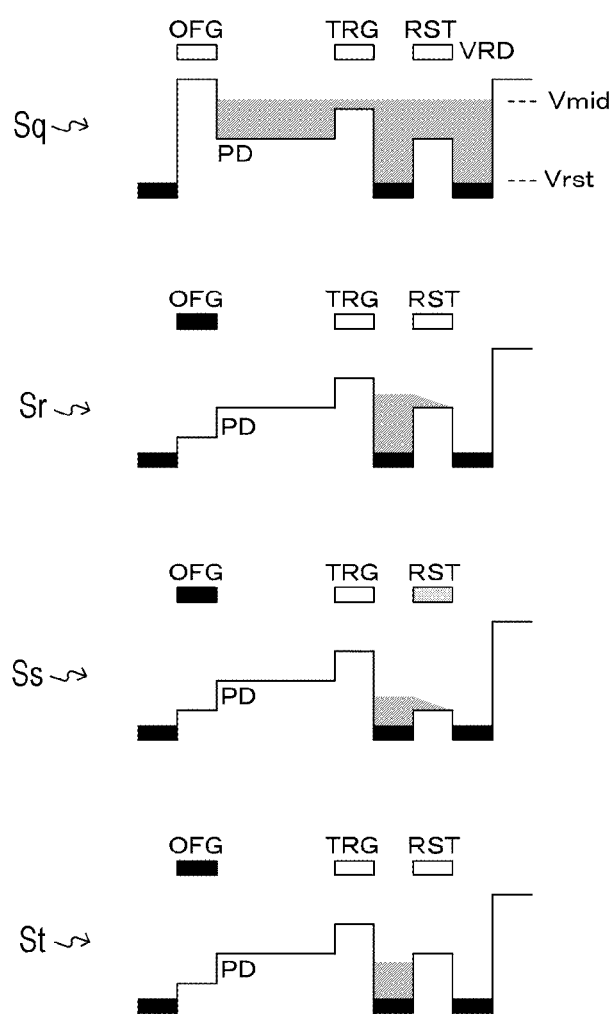
FIG. 7 is a diagram illustrating an exemplary operation of a discharging unit 180 in each pixel of the pixel array unit 100 of the embodiment of the present technology.

FIG. 7 is a diagram illustrating an exemplary operation of the discharging unit 180 in each pixel of the pixel array unit 100 of the embodiment of the present technology. Although the exemplary operation in a case where the discharging unit 180 is not disposed has been described above, the exemplary operation in a case where the discharging unit 180 is disposed will be described hereinbelow. In this example, the discharging unit 180 is kept open during a reset operation in logarithmic reading to selectively discharge charges accumulated by light reception in the photoelectric conversion unit 110.

A state Sq is a state corresponding to the state Sl described above in which all of the photoelectric conversion unit 110, the charge-voltage conversion unit 130, and the reset drain have Vmid and are filled with charges.

Then, the reset drain control unit 224 returns the reset drain voltage VRD to the reset voltage Vrst. At this time, the charge transfer unit 120 and the charge reset unit 140 remain in the nonconducting state. As a result, the photoelectric conversion unit 110 and the charge-voltage conversion unit 130 reach the respective saturation levels. Then, the discharge control unit 225 brings the overflow gate signal OFG to the H level. In response to this, the discharging unit 180 enters a conducting state. Accordingly, as illustrated in a state Sr, charges accumulated in the photoelectric conversion unit 110 are discharged through the discharging unit 180.

Then, the reset control unit 222 applies the intermediate potential to the reset signal RST. Further, the transfer control unit 223 temporarily brings the transfer signal TRG to the H level and then brings the transfer signal TRG to the L level. As a result, as illustrated in a state Ss, charges accumulated in the charge reset unit 140 by the intermediate potential are left in the charge-voltage conversion unit 130.

Then, the reset control unit 222 brings the reset signal RST to the L level. In response to this, the charge reset unit 140 enters a nonconducting state. In this state, the column processing unit 230 reads the noise signal N2 at high illuminance by logarithmic reading.

In this manner, it is possible to prevent charges from overflowing from the charge transfer unit 120 and mixing into the charge-voltage conversion unit 130 by keeping the discharging unit 180 open during the reset operation in logarithmic reading to discharge charges accumulated by light reception in the photoelectric conversion unit 110.

[Configuration of Pixel]

Figure 8:
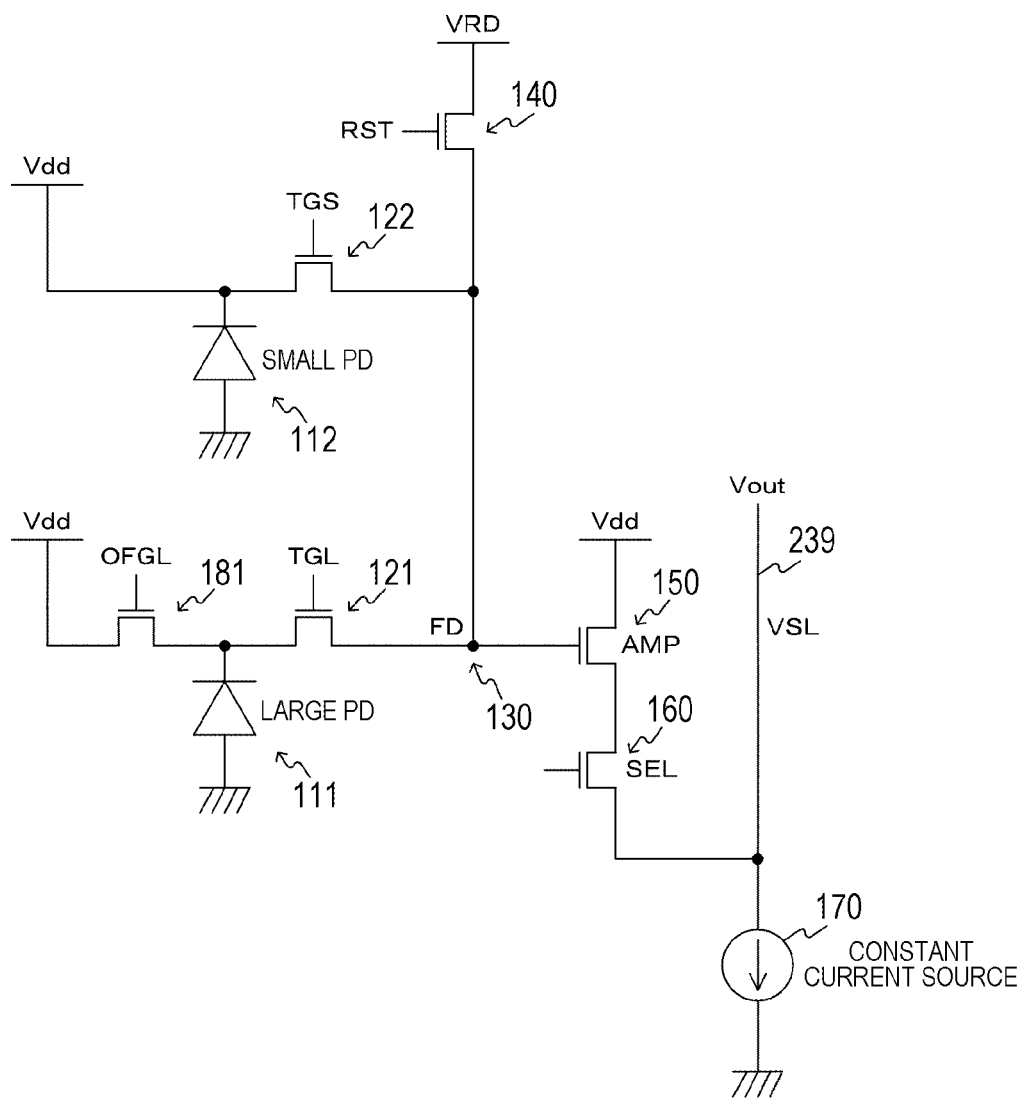
FIG. 8 is a diagram illustrating an exemplary configuration of each pixel of a pixel array unit 100 in a first embodiment of the present technology.

FIG. 8 is a diagram illustrating an exemplary configuration of each pixel of the pixel array unit 100 in the first embodiment of the present technology. As described above, in a case where the light quantity of high illuminance is read by logarithmic reading, it is necessary to cause charges to overflow from the photoelectric conversion unit up to the drain power source. Thus, a small photoelectric conversion unit is advantageous. On the other hand, in a case where the photoelectric conversion unit is downsized, the sensitivity is insufficient to read the light quantity of low illuminance by linear reading. Thus, in the present embodiment, each pixel includes, inside thereof, a first photoelectric conversion unit 111 which photoelectrically converts incident light into charges and accumulates the charges in a first region and a second photoelectric conversion unit 112 which photoelectrically converts incident light into charges and accumulates the charges in a second region having a smaller area than the first region. In other words, the large and small photoelectric conversion units 111 and 112 having different sizes are disposed in one pixel region. Note that the photoelectric conversion units 111 and 112 are examples of the first and second photoelectric conversion units described in the Maims.

Charge transfer units 121 and 122 are disposed corresponding to the photoelectric conversion units 111 and 112, respectively. A transfer signal TGL and a transfer signal TGS are supplied to the charge transfer unit 121 and the charge transfer unit 122, respectively, by the transfer control unit 223. On the other hand, the charge-voltage conversion unit 130, the charge reset unit 140, the signal amplifying unit 150, and the pixel selecting unit 160 are similar to those in the above circuit configuration and shared in one pixel. Note that the photoelectric conversion units 111 and 112 are examples of the first and second charge transfer units described in the claims.

Further, in this example, a discharging unit 181 is connected only to the photoelectric conversion unit 111 and not connected to the photoelectric conversion unit 112. The discharging unit 181 discharges charges accumulated in the photoelectric conversion unit 111 in accordance with an overflow gate signal OFGL supplied from the discharge control unit 225. Note that the discharging unit 181 is an example of the first discharging unit described in the claims.

In the exemplary configuration of the first embodiment, the photoelectric conversion unit 111 having a large area acquires a relatively low illuminance signal by performing normal linear reading. On the other hand, the photoelectric conversion unit 112 having a small area acquires a relatively high illuminance signal by the logarithm using logarithmic reading. Then, an image of a high dynamic range can be captured by combining the signals acquired by readings suitable for the respective illuminances in each pixel region by the signal processing unit 280.

In a case where the large and small photoelectric conversion units 111 and 112 having different sizes are disposed in this manner, if a signal of the photoelectric conversion unit 112 which has a small area and performs logarithmic reading mixes into the photoelectric conversion unit 111 having a large area, there is a possibility that charges may overflow to an unexpected location from the photoelectric conversion unit 111. In this point, in the present embodiment, since the discharging unit 181 is connected to the photoelectric conversion unit 111 having a large area, the discharging unit 181 is kept open to discharge charges from the photoelectric conversion unit 111 when logarithmic reading is performed in the photoelectric conversion unit 112. Accordingly, the mixing of charges into the photoelectric conversion unit 111 in logarithmic reading is prevented.

In this manner, in the first embodiment of the present technology, the photoelectric conversion units 111 and 112 having different sizes are disposed inside each pixel, and the discharging unit 181 is connected only to the photoelectric conversion unit 111 having a large area. Further, when logarithmic reading is performed in the photoelectric conversion unit 112, the discharging unit 181 is kept open to discharge charges from the photoelectric conversion unit 111. Accordingly, it is possible to prevent charges from mixing into the photoelectric conversion unit 111 in logarithmic reading to prevent malfunction.

[Modification]

Figure 9:
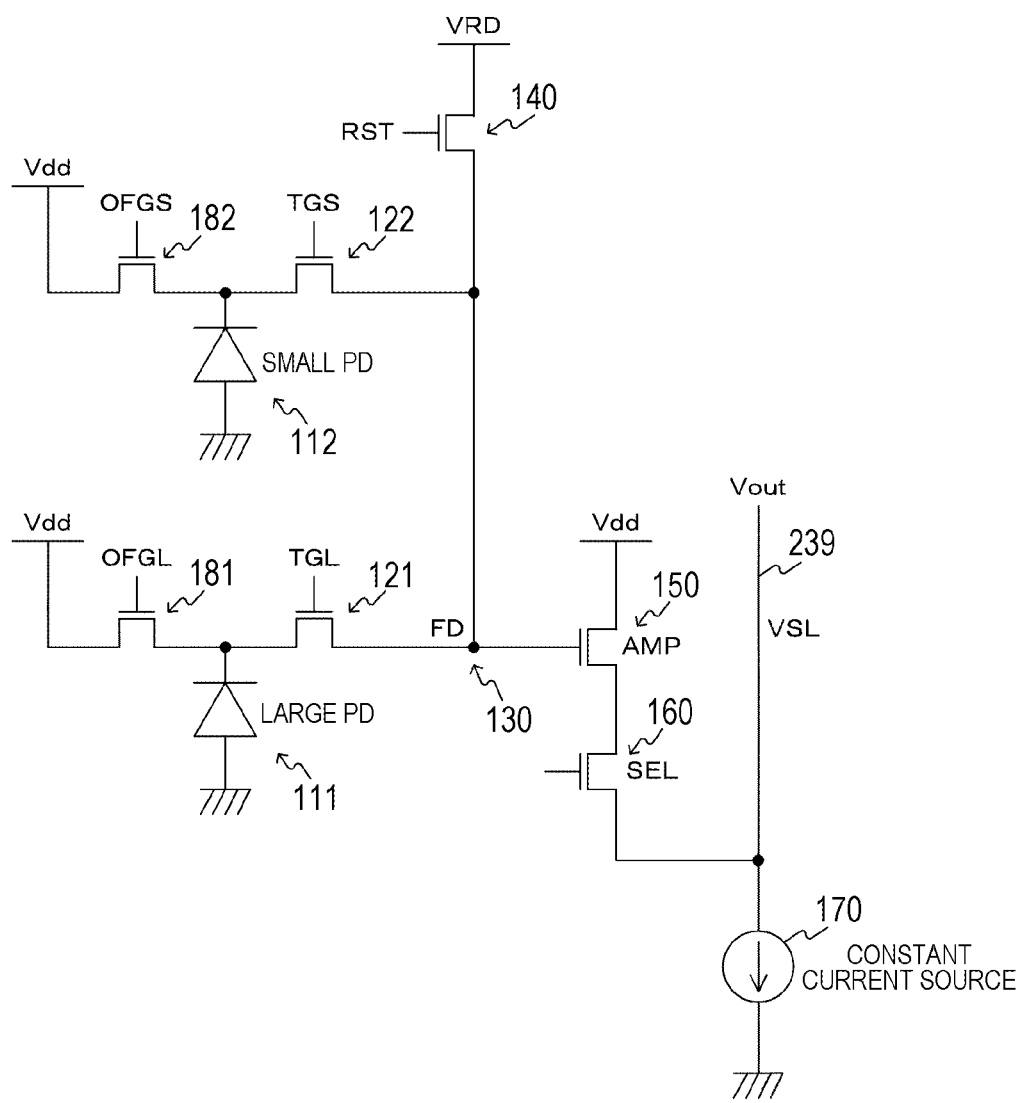
FIG. 9 is a diagram illustrating an exemplary configuration of each pixel of a pixel array unit 100 in a modification of the first embodiment of the present technology.

FIG. 9 is a diagram illustrating an exemplary configuration of each pixel of a pixel array unit 100 in a modification of the first embodiment of the present technology. In this modification, the discharging unit 181 is connected to the photoelectric conversion unit 111 having a large area, and, further, a discharging unit 182 is connected to the photoelectric conversion unit 112 having a small area, the photoelectric conversion unit 112 being disposed inside the pixel. Note that the discharging unit 182 is an example of the second discharging unit described in the claims.

As described above, since light is received also when noise is read in the operation for reducing variations, and the illuminance is high when the photoelectric conversion unit 112 having a small area performs logarithmic reading, there is a possibility that overflowing charges mix into the charge-voltage conversion unit 130 after intermediate reset. Thus, the discharging unit 182 connected to the photoelectric conversion unit 112 having a small area is kept open during a reset operation in logarithmic reading to selectively discharge charges accumulated by light reception in the photoelectric conversion unit 112. This configuration prevents the mixing of a signal during reset by the intermediate potential of the charge reset unit 140.

In this manner, in the modification of the first embodiment of the present technology, the discharging unit 182 is connected to the photoelectric conversion unit 112 having a small area and kept open during a reset operation in logarithmic reading to selectively discharge charges accumulated by light reception in the photoelectric conversion unit 112. With this configuration, it is possible to prevent the mixing of a signal during reset by the intermediate potential of the charge reset unit 140.

2. Second Embodiment

In the first embodiment described above, normal reading is performed by the photoelectric conversion unit 111 having a large area at low illuminance, and logarithmic reading is performed by the photoelectric conversion unit 112 having a small area at high illuminance. At this time, in a case where the illuminance is too low, a sufficient resolution cannot be obtained even by the photoelectric conversion unit 111 having a large area, and it may be difficult to perform precise reading. Thus, in the second embodiment, a conversion efficiency switching unit is disposed between the photoelectric conversion units 111 and 112 to improve the conversion efficiency in a case where the illuminance is too low to perform reading with high accuracy.

[Configuration of Pixel]

Figure 10:
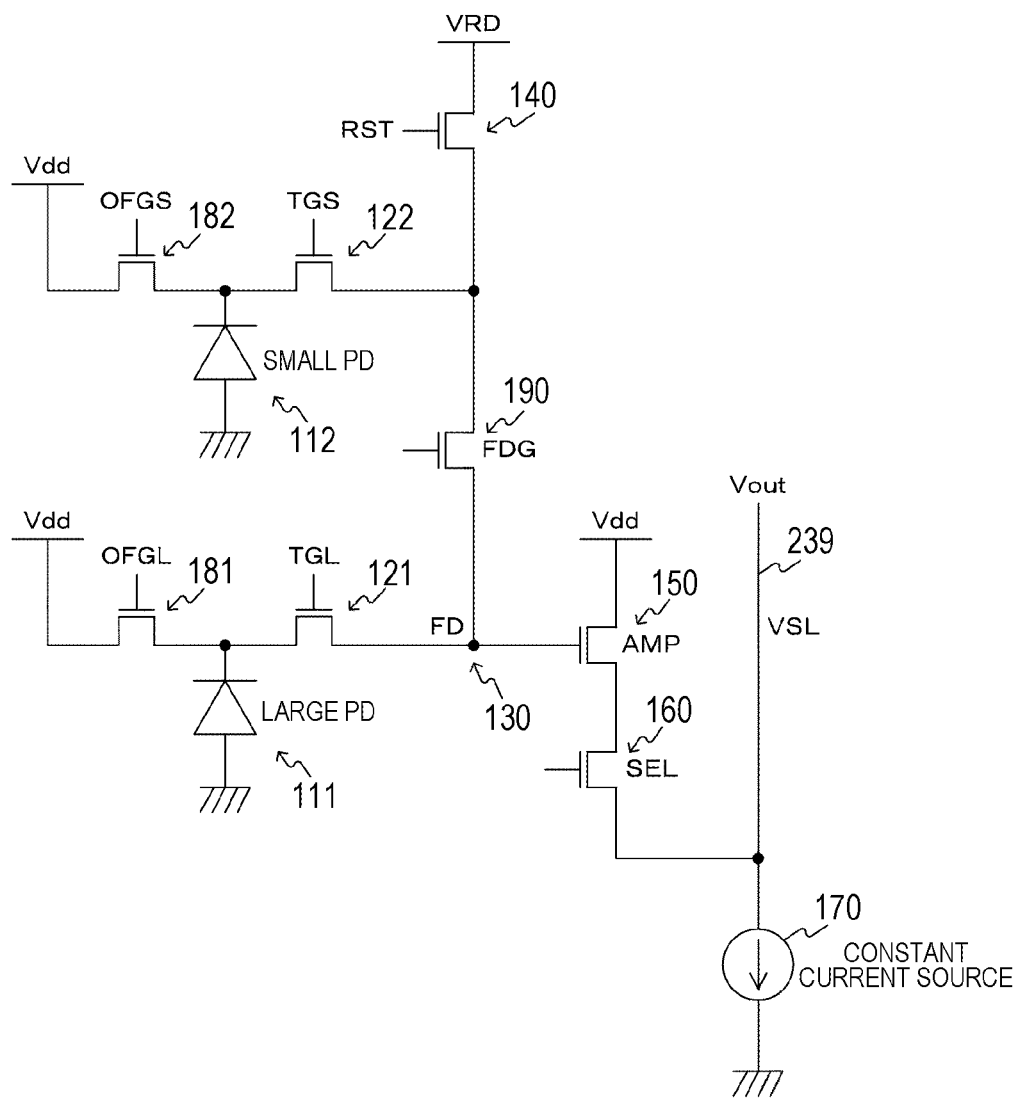
FIG. 10 is a diagram illustrating an exemplary configuration of each pixel of a pixel array unit 100 in a second embodiment of the present technology.

FIG. 10 is a diagram illustrating an exemplary configuration of each pixel of a pixel array unit 100 in the second embodiment of the present technology. Note that, since the entire configuration of a solid state imaging device 10 is similar to that in the above first embodiment, derailed description thereof will be omitted.

In the second embodiment, discharging units 181 and 182 are connected to large and small photoelectric conversion units 111 and 112 having different sizes, respectively, in a manner similar to the modification of the first embodiment described above. Further, a conversion efficiency switching unit 190 is disposed between charge transfer units 121 and 122 which are connected to the photoelectric conversion units 111 and 112, respectively. The conversion efficiency switching unit 190 switches the conversion efficiency from charges accumulated in a charge-voltage conversion unit 130 to a voltage. The conversion efficiency switching unit 190 is controlled by a conversion efficiency switching signal FDG which is supplied from a vertical driving unit 220, and performs an on-off operation as a transistor. With this configuration, it is possible to switch the capacitance of the charge-voltage conversion unit 130 to switch a gain (amplification degree) in a signal amplifying unit 150.

FIG. 11 is a diagram illustrating an exemplary potential in an operating state of the second embodiment of the present technology.

In FIG. 11, a illustrates a state in logarithmic reading by the photoelectric conversion unit 112 having a small area. As described above, logarithmic reading is performed by the photoelectric conversion unit 112 having a small area on a high illuminance signal. At this time, it is necessary to keep the conversion efficiency switching unit 190 open. In other words, the conversion efficiency switching signal FDG is brought to the H level, and the capacitance of the charge-voltage conversion unit 130 is brought to a state similar to the above first embodiment.

In FIG. 11, b illustrates a state in high-sensitivity reading by the photoelectric conversion unit 111 having a large area. In order to acquire a low illuminance signal with higher sensitivity, the conversion efficiency switching unit 190 is kept closed to reduce the capacitance of the charge-voltage conversion unit 130. In other words, the conversion efficiency switching signal FDG is brought to the L level to keep the conversion efficiency switching unit 190 closed. With this configuration, it is possible to obtain a sufficient resolution with respect to a low illuminance signal.

In FIG. 11, c illustrates a state in normal-sensitivity reading by the photoelectric conversion unit 111 having a large area. Normal-sensitivity reading by the photoelectric conversion unit 111 having a large area is performed on a signal with a degree of illuminance for which it is not necessary to obtain high resolution by keeping the conversion efficiency switching unit 190 open. In other words, the conversion efficiency switching signal FDG is brought to the H level to bring the capacitance of the charge-voltage conversion unit 130 to a state similar to the above first embodiment.

FIG. 12 is a diagram illustrating an example of a light response characteristic of each pixel of the pixel array unit 100 in the second embodiment of the present technology. Here, a light quantity to be a target of the high-sensitivity reading is defined as a low illuminance, a light quantity to be a target of the logarithmic reading is defined as a high illuminance, and a connection range between the low illuminance and the high illuminance is defined as a medium illuminance.

In FIG. 12, a illustrates a light response characteristic of the logarithmic reading by the photoelectric conversion unit 112 having a small area. At this time, the conversion efficiency switching unit 190 is in an open state, and a high illuminance signal is acquired by the logarithm. Although a high illuminance signal is saturated by reading by the photoelectric conversion unit 111 having a large area, and a value becomes constant regardless of the light quantity, a signal quantity according to the light quantity can be acquired by the logarithmic reading.

In FIG. 12, b illustrates a light response characteristic of the high-sensitivity reading by the photoelectric conversion unit 111 having a large area. At this time, the conversion efficiency switching unit 190 is in a closed state, and a sufficient resolution can be acquired with respect to a low illuminance signal.

In FIG. 12, c illustrates a light response characteristic of the normal-sensitivity reading by the photoelectric conversion unit 111 having a large area. At this time, the conversion efficiency switching unit 190 is in an open state, and a medium illuminance signal in the connection range between the high illuminance and the low illuminance is acquired by expanding a receivable light quantity range while lowering the resolution as compared to the case of low illuminance. The response in the medium illuminance region varies according to driving.

A signal processing unit 280 multiplies the signal obtained by the logarithmic reading by the photoelectric conversion unit 112 and the signal obtained by the normal-sensitivity reading by the photoelectric conversion unit 111 by a ratio of the conversion efficiency to create an image conforming to the signal level in the high-sensitivity reading.

[Reading Timing]

Figure 13:
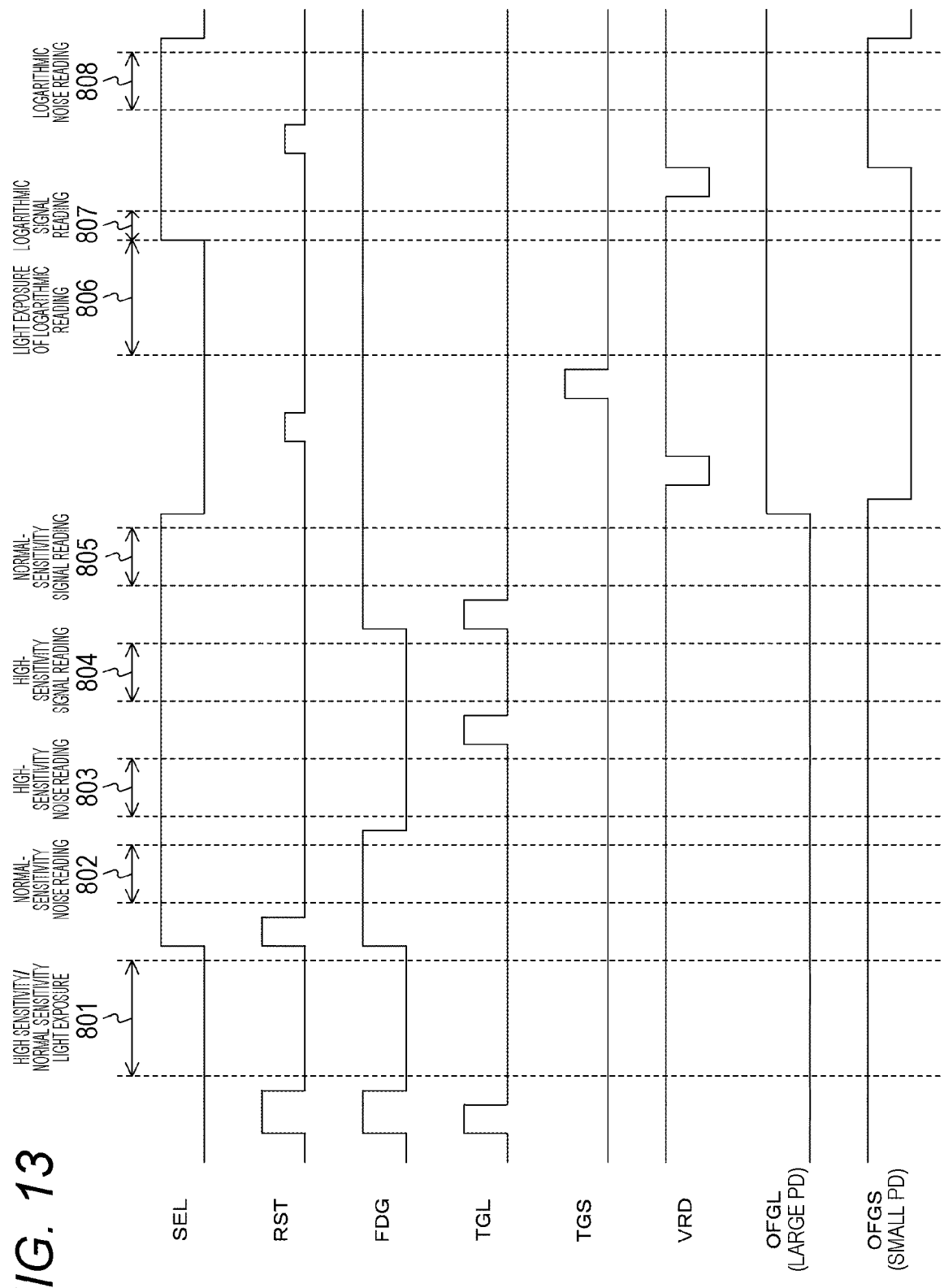
FIG. 13 is a diagram illustrating an example of a reading timing of each pixel of the pixel array unit 100 in the second embodiment of the present technology.

FIG. 13 is a diagram illustrating an example of a reading timing of each pixel of the pixel array unit 100 in the second embodiment of the present technology.

First, after reset of the photoelectric conversion unit 111 having a large area is performed, light exposure is performed (801). Signal and noise readings at low illuminance and medium illuminance are performed by the light exposure (802 to 805). More specifically, medium illuminance noise is read with normal sensitivity with the conversion efficiency switching unit 190 open (802). Then, low illuminance noise and signal are read with high sensitivity with the conversion efficiency switching unit 190 closed (803, 804). Then, a medium illuminance signal is read with normal sensitivity with the conversion efficiency switching unit 190 open again (805).

During this, the discharging unit 181 connected to the photoelectric conversion unit 111 is in an off state, and the discharging unit 182 connected to the photoelectric conversion unit 112 is in an on state. In other words, light exposure and reading are performed in the photoelectric conversion unit 111 having a large area, but, on the other hand, no reading is performed in the photoelectric conversion unit 112 having a small area because charges are discharged.

Then, the discharging unit 181 connected to the photoelectric conversion unit 111 enters an on state, and the discharging unit 182 connected to the photoelectric conversion unit 112 enters an off state. Accordingly, no reading is performed in the photoelectric conversion unit 111 having a large area because charges are discharged. Then, after reset by the intermediate potential of the charge reset unit 140 is performed, light exposure is performed in the photoelectric conversion unit 112 having a small area (806). Logarithmic readings of a signal and noise at high illuminance are performed by the light exposure (807, 808). Note that, in order to reduce the mixing of a signal during reset by the intermediate potential of the charge reset unit 140, the discharging unit 182 connected to the photoelectric conversion unit 112 is in an on state during the logarithmic reading of noise (808). Further, in the logarithmic reading, the conversion efficiency switching unit 190 is in an open state (on state).

In this manner, according to the second embodiment of the present technology, it is possible to improve the conversion efficiency with respect to a low illuminance signal to perform reading with high accuracy by disposing the conversion efficiency switching unit 190 between the photoelectric conversion units 111 and 112.

Note that the above embodiments are described as examples for embodying the present technology, and there is a correspondence relationship between a matter in the embodiments and a matter specifying the invention in the claims. Similarly, there is a correspondence relationship between a matter specifying the invention in the claims and a matter identified by the same name as the matter specifying the invention in the embodiments of the present technology. However, the present technology is not limited to the embodiments, and can be embodied by various modifications made on the embodiments within the scope of the present technology.

Further, the series of procedural steps described in the above embodiments may be regarded as a method including the series of procedural steps, or may be regarded as a program for causing a computer to execute the series of procedural steps or a recording medium that stores the program therein. For example, a compact disc (CD), a mini disc (ND), a digital versatile disc (DVD), a memory card, a Blue-ray (registered trademark) disc, or the like can be used as the recording medium.

Note that the effects described in the present specification are merely examples. The effects of the present technology are not limited to the described effects, and the present technology may have another effect.

Additionally, the present technology may also be configured as described below.

(1) A solid state imaging device including:
a first photoelectric conversion unit configured to photoelectrically convert incident light into charges and accumulate the charges in a first region;
a second photoelectric conversion unit configured to photoelectrically convert incident light into charges and accumulate the charges in a second region having a smaller area than the first region;
a charge-voltage conversion unit configured to accumulate charges photoelectrically converted by the first photoelectric conversion unit and the second photoelectric conversion unit for converting the charges into a voltage;
a first charge transfer unit configured to transfer charges accumulated in the first photoelectric conversion unit to the charge-voltage conversion unit;
a second charge transfer unit configured to transfer charges accumulated in the second photoelectric conversion unit to the charge-voltage conversion unit;
a charge reset unit configured to reset charges accumulated in the charge-voltage conversion unit; and
a first discharging unit configured to discharge charges accumulated in the first photoelectric conversion unit.

(2) The solid state imaging device according to (1), further including a driving unit configured to perform driving in such a manner that the driving unit controls a potential of a drain of the charge reset unit while causing the first discharging unit to discharge charges accumulated in the first photoelectric conversion unit to accumulate the charges in the second photoelectric conversion unit and the charge-voltage conversion unit up to a saturation level, and then exposes the second photoelectric conversion unit to light.

(3) The solid state imaging device according to (2), further including a second discharging unit configured to discharge charges accumulated in the second photoelectric conversion unit, in which
the driving unit performs driving in such a manner that the driving unit controls the potential of the drain of the charge reset unit while causing the first discharging unit to discharge charges accumulated in the first photoelectric conversion unit to accumulate charges in the second photoelectric conversion unit and the charge-voltage conversion unit up to a saturation level, then applies an intermediate potential to the charge reset unit while causing the second discharging unit to discharge charges accumulated in the second photoelectric conversion unit to accumulate charges in the charge-voltage conversion unit, further brings the charge reset unit to a nonconducting state and then causes charges accumulated in the charge-voltage conversion unit to be transferred to the charge-voltage conversion unit, and then exposes the second photoelectric conversion unit to light.

(4) The solid state imaging device according to (3), further including a signal amplifying unit configured to amplify charges accumulated in the charge-voltage conversion unit and output a pixel signal of a level corresponding to the charges.

(5) The solid state imaging device according to (4), further including a conversion efficiency switching unit configured to switch a capacitance of the charge-voltage conversion unit to switch an amplification degree in the signal amplifying unit.

(6) A driving method of a solid state imaging device, the solid state imaging device including
a first photoelectric conversion unit configured to photoelectrically convert incident light into charges and accumulate the charges in a first region,
a second photoelectric conversion unit configured to photoelectrically convert incident light into charges and accumulate the charges in a second region having a smaller area than the first region,
a charge-voltage conversion unit configured to accumulate charges photoelectrically converted by the first photoelectric conversion unit and the second photoelectric conversion unit for converting the charges into a voltage,
a first charge transfer unit configured to transfer charges accumulated in the first photoelectric conversion unit to the charge-voltage conversion unit,
a second charge transfer unit configured to transfer charges accumulated in the second photoelectric conversion unit to the charge-voltage conversion unit,
a charge reset unit configured to reset charges accumulated in the charge-voltage conversion unit, and
a first discharging unit configured to discharge charges accumulated in the first photoelectric conversion unit, the driving method including:
performing driving in such a manner that a potential of a drain of the charge reset unit is controlled while causing the first discharging unit to discharge charges accumulated in the first photoelectric conversion unit to accumulate the charges in the second photoelectric conversion unit and the charge-voltage conversion unit up to a saturation level, and then the second photoelectric conversion unit to light is exposed.

(7) An electronic device including:

a first photoelectric conversion unit configured to photoelectrically convert incident light into charges and accumulate the charges in a first region;

a second photoelectric conversion unit configured to photoelectrically convert incident light into charges and accumulate the charges in a second region having a smaller area than the first region;

a charge-voltage conversion unit configured to accumulate charges photoelectrically converted by the first photoelectric conversion unit and the second photoelectric conversion unit for converting the charges into a voltage;

a first charge transfer unit configured to transfer charges accumulated in the first photoelectric conversion unit to the charge-voltage conversion unit;

a second charge transfer unit configured to transfer charges accumulated in the second photoelectric conversion unit to the charge-voltage conversion unit;

a charge reset unit configured to reset charges accumulated in the charge-voltage conversion unit;

a first discharging unit configured to discharge charges accumulated in the first photoelectric conversion unit; and a driving unit configured to perform driving in such a manner that the driving unit controls a potential of a drain of the charge reset unit while causing the first discharging unit to discharge charges accumulated in the first photoelectric conversion unit to accumulate the charges in the second photoelectric conversion unit and the charge-voltage conversion unit up to a saturation level, and then exposes the second photoelectric conversion unit to light.

REFERENCE SIGNS LIST

10 Solid state imaging device
100 Pixel array unit
110 to 112 Photoelectric conversion unit
120 to 122 Charge transfer unit
130 Charge-voltage conversion unit
140 Charge reset unit
150 Signal amplifying unit
160 Pixel selecting unit
170 Constant current source
180 to 182 Discharging unit
190 Conversion efficiency switching unit
220 Vertical driving unit
221 Selection control unit
222 Reset control unit
223 Transfer control unit
224 Reset drain control unit
225 Discharge control unit
229 Pixel driving line
230 Column processing unit
239 Vertical signal line
240 Horizontal driving unit
250 System control unit
280 Signal processing unit
290 Data storage unit

What is claimed is:

1. A solid state imaging device comprising:

a first photoelectric conversion unit configured to photoelectrically convert incident light into first charges and accumulate the first charges in a first region;

a second photoelectric conversion unit configured to photoelectrically convert incident light into second charges and accumulate the second charges in a second region having a smaller area than the first region;

a charge-voltage conversion unit configured to accumulate the first charges photoelectrically converted by the first photoelectric conversion unit and the second charges photoelectrically converted by the second photoelectric conversion unit for converting into a voltage;

a first charge transfer unit configured to transfer the first charges accumulated in the first region to the charge-voltage conversion unit;

a second charge transfer unit configured to transfer the second charges accumulated in the second region to the charge-voltage conversion unit;

a charge reset unit configured to reset charges accumulated in the charge-voltage conversion unit;

a first discharging unit configured to discharge charges accumulated in the first region; and a driving unit configured to perform driving in such a manner that the driving unit controls a potential of a drain of the charge reset unit while causing the first discharging unit to discharge the first charges accumulated in the first region, to accumulate the second charges in the second region and the first and second charges in the charge-voltage conversion unit up to a saturation level, and to expose the second photoelectric conversion unit to light.

2. The solid state imaging device according to claim 1, further comprising a second discharging unit configured to discharge the second charges accumulated in the second region, wherein the driving unit applies an intermediate potential to the charge reset unit while causing the second discharging unit to discharge the second charges accumulated in the second region, to accumulate the second charges in the charge-voltage conversion unit, to bring the charge reset unit to a nonconducting state, and to cause the second charges to be transferred to the charge-voltage conversion unit, and to expose the second photoelectric conversion unit to light.

3. The solid state imaging device according to claim 2, further comprising a signal amplifying unit configured to amplify charges accumulated in the charge-voltage conversion unit and output a pixel signal of a level corresponding to the amplified charges.

4. The solid state imaging device according to claim 3, further comprising a conversion efficiency switching unit configured to switch a capacitance of the charge-voltage conversion unit to switch an amplification degree in the signal amplifying unit.

5. A driving method of a solid state imaging device, the solid state imaging device including a first photoelectric conversion unit configured to photoelectrically convert incident light into first charges and accumulate the first charges in a first region, a second photoelectric conversion unit configured to photoelectrically convert incident light into second charges and accumulate the second charges in a second region having a smaller area than the first region, a charge-voltage conversion unit configured to accumulate the first charges photoelectrically converted by the first photoelectric conversion unit and the second charges photoelectrically converted by the second photoelectric conversion unit for converting into a voltage, a first charge transfer unit configured to transfer the first charges accumulated in the first region to the charge-voltage conversion unit, a second charge transfer unit configured to transfer the second charges accumulated in the second region to the charge-voltage conversion unit, a charge reset unit configured to reset charges accumulated in the charge-voltage conversion unit, and a first discharging unit configured to discharge charges accumulated in the first photoelectric conversion unit, the driving method comprising:

performing driving in such a manner that a potential of a drain of the charge reset unit is controlled while causing the first discharging unit to discharge the first charges accumulated in the first region, to accumulate the second charges in the second region and the first and second charges in the charge-voltage conversion unit up to a saturation level, and to expose the second photoelectric conversion unit to light.

6. An electronic device comprising:

a first photoelectric conversion unit configured to photoelectrically convert incident light into first charges and accumulate the first charges in a first region;

a second photoelectric conversion unit configured to photoelectrically convert incident light into second charges and accumulate the second charges in a second region having a smaller area than the first region;

a charge-voltage conversion unit configured to accumulate the first charges photoelectrically converted by the first photoelectric conversion unit and the second charges photoelectrically converted by the second photoelectric conversion unit for converting into a voltage;

a first charge transfer unit configured to transfer the first charges accumulated in the first region to the charge-voltage conversion unit;

a second charge transfer unit configured to transfer the second charges accumulated in the second region to the charge-voltage conversion unit;

a charge reset unit configured to reset charges accumulated in the charge-voltage conversion unit;

a first discharging unit configured to discharge charges accumulated in the first region; and a driving unit configured to perform driving in such a manner that the driving unit controls a potential of a drain of the charge reset unit while causing the first discharging unit to discharge the first charges accumulated in the first region, to accumulate the charges in the second region and the first and second charges in the charge-voltage conversion unit up to a saturation level, and to expose the second photoelectric conversion unit to light.

* * * * *